(12) United States Patent
Violette

(10) Patent No.: US 8,320,181 B2
(45) Date of Patent: Nov. 27, 2012

(54) 3D MEMORY DEVICES DECODING AND ROUTING SYSTEMS AND METHODS

(75) Inventor: Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 12/547,337

(22) Filed: Aug. 25, 2009

(65) Prior Publication Data

US 2011/0051512 A1 Mar. 3, 2011

(51) Int. Cl.
*G11C 11/34* (2006.01)
(52) U.S. Cl. .................. 365/185.17; 365/185.11
(58) Field of Classification Search ............ 365/189.17, 365/158.11, 185.01, 185.17, 185.11
See application file for complete search history.

(56) References Cited

U.S. PATENT DOCUMENTS

| | | | |
|---|---|---|---|
| 4,123,799 A * | 10/1978 | Peterson | 365/205 |
| 5,276,343 A * | 1/1994 | Kumagai et al. | 257/306 |
| 5,625,590 A * | 4/1997 | Choi et al. | 365/185.17 |
| 6,333,254 B1 | 12/2001 | Abbott | |
| 6,369,431 B1 | 4/2002 | Gonzalez | |
| 6,376,284 B1 | 4/2002 | Gonzalez | |
| 6,380,596 B1 | 4/2002 | Abbott | |
| 6,403,458 B2 | 6/2002 | Trivedi | |
| 6,535,413 B1 | 3/2003 | Abbott | |
| 6,563,220 B2 | 5/2003 | Gonzalez | |
| 6,570,232 B2 | 5/2003 | Trivedi | |
| 6,594,172 B2 | 7/2003 | Abbott | |
| 6,653,733 B1 | 11/2003 | Gonzalez | |
| 6,670,713 B2 | 12/2003 | Gonzalez | |
| 6,693,025 B2 | 2/2004 | Tang et al. | |
| 6,700,211 B2 | 3/2004 | Gonzalez | |
| 6,844,601 B2 | 1/2005 | Trivedi | |
| 6,858,934 B2 | 2/2005 | Tang et al. | |
| 6,861,697 B1 | 3/2005 | Violette | |
| 6,930,901 B2 | 8/2005 | Abbott | |
| 6,936,507 B2 | 8/2005 | Tang et al. | |
| 6,951,790 B1 | 10/2005 | Violette | |
| 7,005,350 B2 | 2/2006 | Walker et al. | |
| 7,071,043 B2 | 7/2006 | Tang et al. | |
| 7,087,468 B2 | 8/2006 | Gonzalez | |
| 7,115,967 B2 | 10/2006 | Cleeves | |
| 7,118,950 B2 | 10/2006 | Tang et al. | |
| 7,176,086 B2 | 2/2007 | Violette | |
| 7,276,414 B2 | 10/2007 | Violette | |
| 7,276,733 B2 | 10/2007 | Violette | |

(Continued)

OTHER PUBLICATIONS

PCT/US2010/045487 International Preliminary Report on Patentability mailed Mar. 8, 2012.

*Primary Examiner* — VanThu Nguyen
*Assistant Examiner* — Khamdan Alrobaie
(74) *Attorney, Agent, or Firm* — Fletcher Yoder

(57) ABSTRACT

3D memory devices are disclosed, such as those that include multiple two-dimensional tiers of memory cells. Each tier may be fully or partially formed over a previous tier to form a memory device having two or more tiers. Each tier may include strings of memory cells where each of the strings are coupled between a source select gate and a drain select gate such that each tier is decoded using the source/drain select gates. Additionally, the device can include a wordline decoder for each tier that is only coupled to the wordlines for that tier.

26 Claims, 6 Drawing Sheets

U.S. PATENT DOCUMENTS

| | | | |
|---|---|---|---|
| 7,332,408 B2 | 2/2008 | Violette | |
| 7,332,789 B2 | 2/2008 | Violette | |
| 7,348,236 B2 | 3/2008 | Abbott | |
| 7,397,689 B2 | 7/2008 | Liu et al. | |
| 7,402,861 B2 | 7/2008 | Abbott | |
| 7,439,157 B2 | 10/2008 | Bian | |
| 7,457,156 B2 | 11/2008 | Nazarian | |
| 7,465,616 B2 | 12/2008 | Tang et al. | |
| 7,470,576 B2 | 12/2008 | Tang et al. | |
| 7,545,669 B2 | 6/2009 | Liu et al. | |
| 2003/0036258 A1 | 2/2003 | Abbott et al. | |
| 2005/0202622 A1 | 9/2005 | Violette et al. | |
| 2005/0215002 A1 | 9/2005 | Violette | |
| 2005/0259468 A1 | 11/2005 | Violette | |
| 2005/0285178 A1 | 12/2005 | Abbott et al. | |
| 2005/0285179 A1 | 12/2005 | Violette | |
| 2005/0287731 A1 | 12/2005 | Bian et al. | |
| 2006/0006456 A1 | 1/2006 | Abbott et al. | |
| 2006/0040447 A1 | 2/2006 | Violette et al. | |
| 2006/0258093 A1 | 11/2006 | Violette et al. | |
| 2007/0063258 A1 | 3/2007 | Violette | |
| 2007/0063262 A1 | 3/2007 | Violette et al. | |
| 2007/0138597 A1 | 6/2007 | Violette | |
| 2007/0141780 A1* | 6/2007 | Higashitani | 438/257 |
| 2007/0242500 A1 | 10/2007 | Liu et al. | |
| 2008/0031048 A1* | 2/2008 | Jeong et al. | 365/185.17 |
| 2008/0067573 A1* | 3/2008 | Jang et al. | 257/315 |
| 2008/0128781 A1 | 6/2008 | Violette | |
| 2008/0186771 A1 | 8/2008 | Katsumata et al. | |
| 2008/0247226 A1 | 10/2008 | Liu | |
| 2008/0258125 A1 | 10/2008 | Liu | |
| 2008/0298113 A1 | 12/2008 | Liu | |
| 2009/0072341 A1 | 3/2009 | Liu | |
| 2009/0168482 A1 | 7/2009 | Park et al. | |
| 2009/0168533 A1 | 7/2009 | Park et al. | |
| 2009/0231917 A1* | 9/2009 | Chae et al. | 365/185.09 |
| 2010/0020602 A1* | 1/2010 | Baek et al. | 365/185.03 |

* cited by examiner

3D MEMORY DEVICES DECODING AND ROUTING SYSTEMS AND METHODS

BACKGROUND

1. Field of Invention

Embodiments of the invention relate generally to memory devices and, specifically, to non-volatile memory array architectures.

2. Description of Related Art

Electronic systems, such as computers, personal organizers, cell phones, portable audio players, etc., typically include one or more memory devices to provide storage capability for the system. System memory is generally provided in the form of one or more integrated circuit chips and generally includes both random access memory (RAM) and read-only memory (ROM). System RAM is typically large and volatile and provides the system's main memory. Static RAM and Dynamic RAM are commonly employed types of random access memory. In contrast, system ROM is generally small and includes non-volatile memory for storing initialization routines and identification information. Non-volatile memory may also be used for caching or general data storage. Electrically-erasable read only memory (EEPROM) is one commonly employed type of read only memory, wherein an electrical charge may be used to program data in the memory.

One type of non-volatile memory that is of particular use is a flash memory. A flash memory is a type of EEPROM that can be erased and reprogrammed in blocks. Flash memory is often employed in personal computer systems in order to store the Basic Input Output System (BIOS) program such that it can be easily updated. Flash memory is also employed in portable electronic devices, such as wireless devices, because of the size, durability, and power requirements of flash memory implementations. Various types of flash memory may exist, depending on the arrangement of the individual memory cells and the requirements of the system or device incorporating the flash memory. For example, NAND flash memory is a common type of flash memory device.

In some architectures, flash memory stores information in an array of floating gate transistors, called "cells", each of which traditionally stores one bit of information that is represented as a "0" or a "1". In other architectures, each cell may store more or less digits of information, such as in multi-level cell (MLC) flash or when a state of a cell may be used to represent a non-integer value. The memory device often includes a grid-like arrangement of the cells. Each of the cells in the grid consumes a given amount of area and is spaced from one another by a generally uniform distance (e.g., pitch). Accordingly, the size and the pitch of the cells directly contribute to the overall size of the memory device. This becomes more evident as the number of cells and associated storage capacity of memory devices increase.

As technology continues to advance, it is often desirable that memory devices decreases in size. Smaller memory devices can be employed in smaller spaces and/or can increase storage capacity in a limited area or volume. One technique for reducing the memory device size may include stacking memory cells in a vertical arrangement (creating a "3D" architecture). As the cells and associated transistors are scaled and densities of such devices increase, manufacture and functionality of such devices may introduce challenges with respect to contacts and signaling for the cells of this 3D architecture.

DETAILED DESCRIPTION

Figure 1:
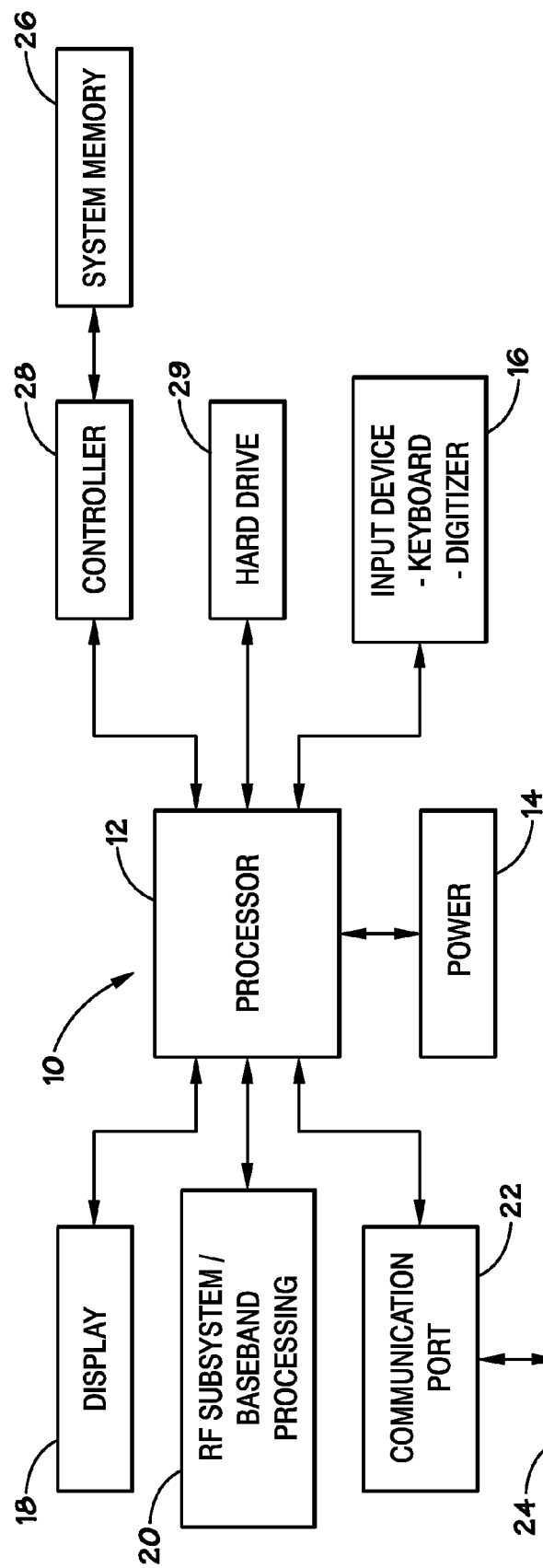
FIG. 1 illustrates a block diagram of an embodiment of a processor-based device having a memory that includes memory devices in accordance with embodiments of the present invention.

FIG. 1 is a block diagram depicting an embodiment of a processor-based system, generally designated by reference numeral 10. The system 10 may be any of a variety of types such as a computer, pager, cellular phone, personal organizer, portable audio player, control circuit, camera, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12, depending on the functions that the system 10 performs. For instance, an input device 16 may be coupled to the processor 12. The input device 16 may include buttons, switches, a keyboard, a light pen, a stylus, a mouse, and/or a voice recognition system, for instance. A display 18 may also be coupled to the processor 12. The display 18 may include an LCD, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Generally, the memory is coupled to the processor 12 to store and facilitate execution of various programs. For instance, the processor 12 may be coupled to system memory 26 through a controller 28. The system memory 26 may include volatile memory, such as Dynamic Random Access Memory (DRAM) and/or Static Random Access Memory (SRAM). The system memory 26 may also include non-volatile memory, such as read-only memory (ROM), PC-RAM, silicon-oxide-nitride-oxide-silicon (SONOS)

memory, metal-oxide-nitride-oxide-silicon (MONOS) memory, polysilicon floating gate based memory, and/or other types of flash memory of various architectures (e.g., NAND memory, NOR memory, etc.) to be used in conjunction with the volatile memory.

As described further below, the system memory 26 may include one or more memory devices, such as flash memory devices, that may be fabricated and operated in accordance with embodiments of the present invention. Such devices may be referred to as or include solid state drives (SSD's), MultimediaMediaCards (MMC's), SecureDigital (SD) cards, CompactFlash (CF) cards, or any other suitable device. Further, it should be appreciated that such devices may couple to the system 10 via any suitable interface, such as Universal Serial Bus (USB), Peripheral Component Interconnect (PCI), PCI Express (PCI-E), Small Computer System Interface (SCSI), IEEE 1394 (Firewire), or any other suitable interface. To facilitate operation of the system memory 26, such as the flash memory devices, the system 10 may include a memory controller 28, as described in further detail below. As will be appreciated, the memory controller 28 may be an independent device or it may be integral with the processor 12. Additionally, the system 10 may include a hard drive 29, such as a magnetic storage device.

Figure 2:
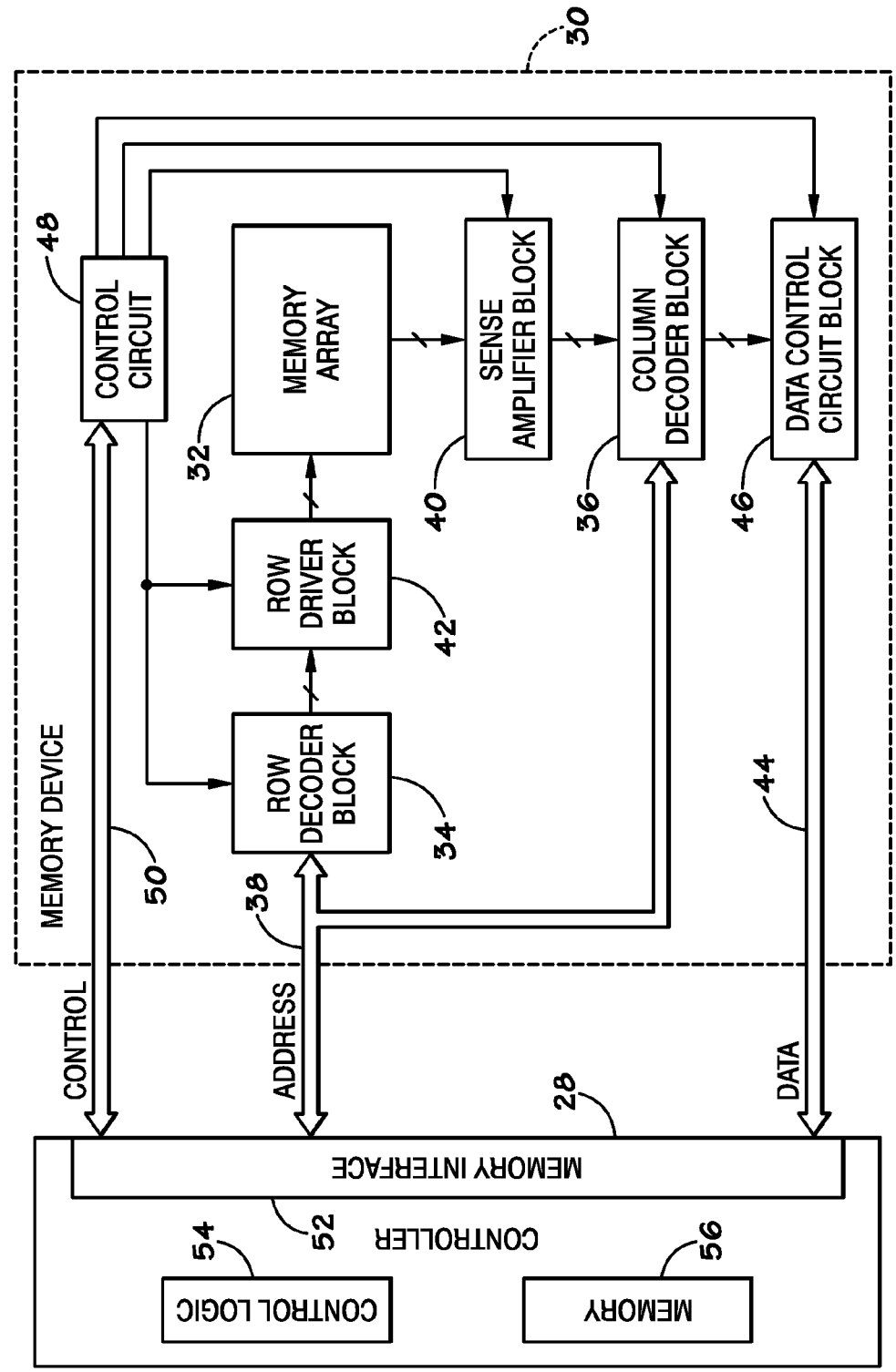
FIG. 2 illustrates a block diagram of an embodiment of a flash memory device having a memory array in accordance with embodiments of the present invention.

FIG. 2 is a block diagram illustrating a flash memory device 30 that may be included as a portion of the system memory 26 of FIG. 1. FIG. 2 also depicts the memory controller 28 coupled to the memory device 30. The flash memory device 30 can include a 3D memory array 32 having multiple tiers of memory cells (as illustrated below in FIGS. 3 and 4). The memory array 32 generally includes many rows and columns of conductive traces arranged in a grid pattern to form a number of memory cells. The lines used to select cells in the memory array 32 are generally referred to herein as "access lines", and are referred to in the industry as "wordlines." The lines used to sense (e.g., read) the cells are generally referred to herein as "digit lines," which are often referred to in the industry as "bit lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the controller 28 via the address bus 38 to access a particular memory cell in the memory array 32. In some embodiments, the address and data information may be multiplexed and provided on the same bus. As discussed in more detail below, each group of wordlines for a tier of the memory array 32 may be decoded by a separate row decoder. A sense block 40, such as one having a plurality of sense amplifiers, is also provided between the column decoder 36 and the memory array 32 to sense (and in some cases amplify) individual values stored in the memory cells. Further, a row driver block 42 is provided between the row decoder block 34 and the memory array 32 to activate a selected word line in the memory array according to a given row address.

During read and program operations, such as a write operation, data may be transferred to and from the flash memory device 30 from the controller 28 via the data bus 44. The coordination of the data and address information may be conducted through a data control circuit block 46. Finally, the flash memory device 30 may include a control circuit 48 configured to receive control signals from the controller 28 via the control bus 50. The control circuit 48 is coupled to each of the row decoder block 34, the column decoder block 36, the sense block 40, the row driver block 42 and the data control circuit block 46, and is generally configured to coordinate timing and control among the various circuits in the flash memory device 30.

As mentioned above, the controller 28 provides control signals over the control bus 50, address signals via the address bus 38, and data via the data bus 44, to the memory device 30. As mentioned above, in some embodiments, the address signals and data may be multiplexed and provided on a single bus. The controller 28 may include a memory interface 52, control logic 54, memory 56 (such as registers) and striping and error control logic 58. The memory interface 52 enables the controller 28 to communicate with the memory device 30. The control logic 54 processes incoming requests and data, such as from the processor 12, and provides signals to the memory device 30 to perform the requests.

Figure 3:
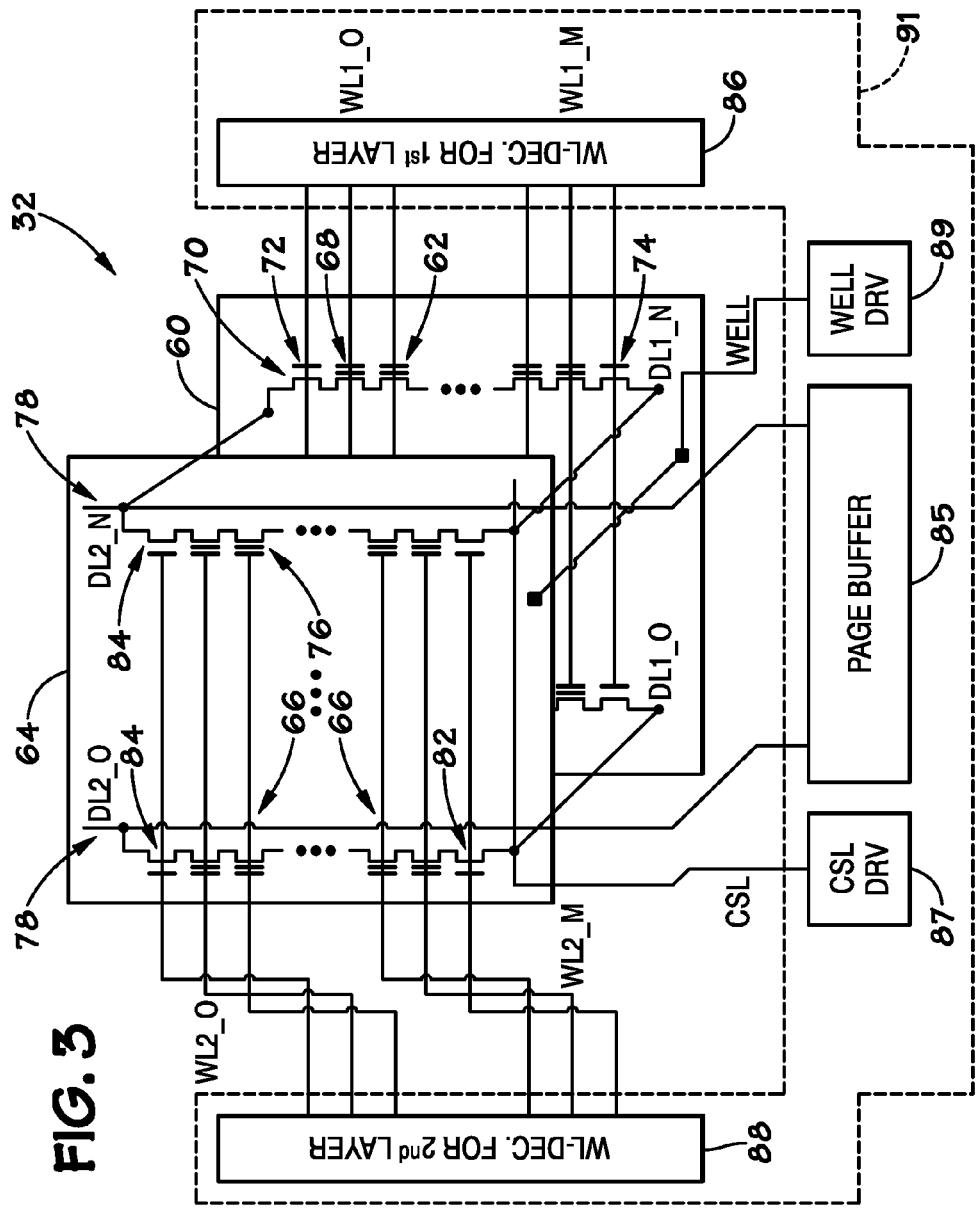
FIG. 3 is a schematic diagram of a 3D array having two tiers in accordance with an embodiment of the present invention.
Figure 4:
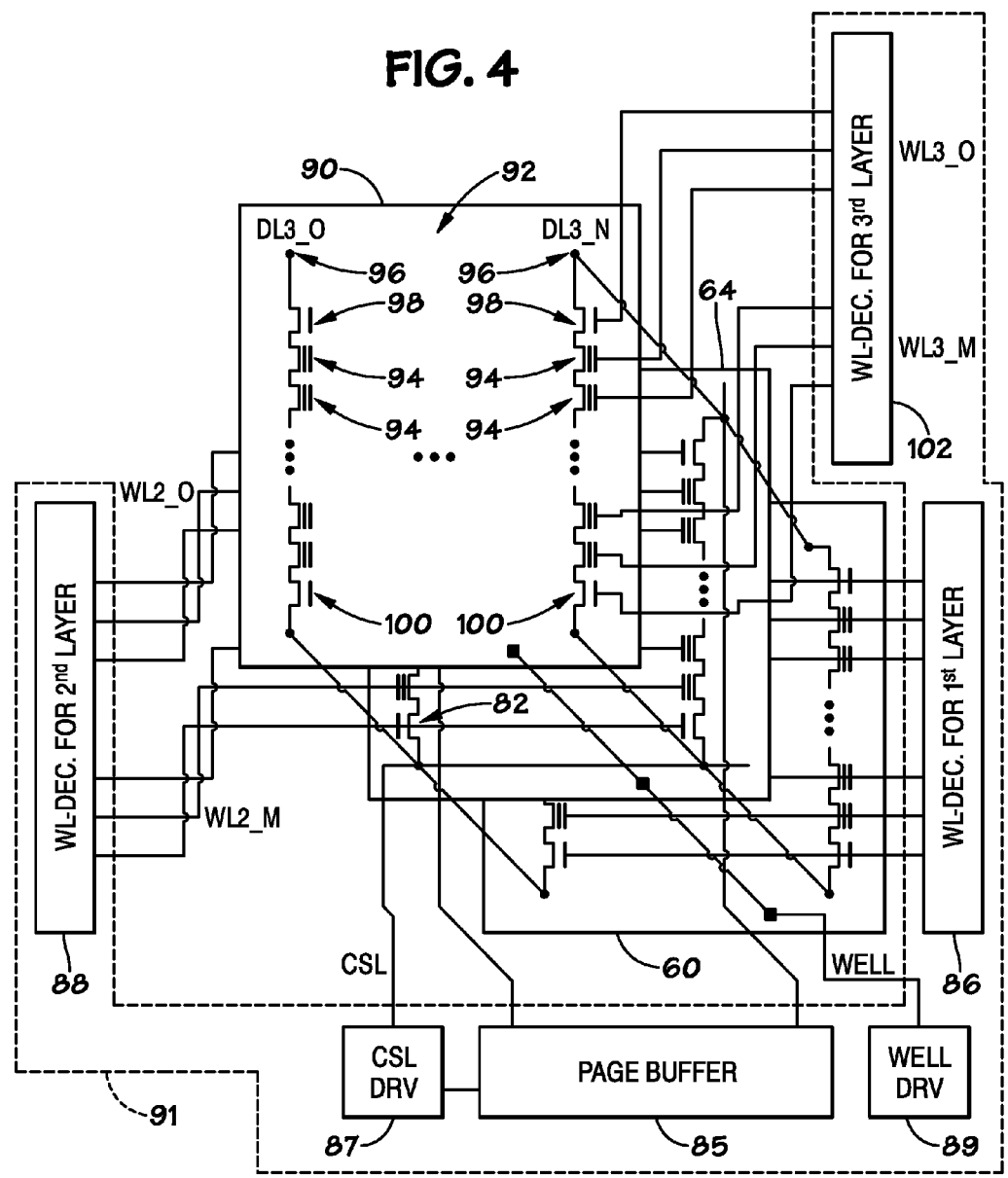
FIG. 4 is schematic diagram of a 3D array having three tiers in accordance with an embodiment of the present invention.

FIG. 3 is a schematic diagram of one potential embodiment 3D array 32 in accordance with an embodiment of the present invention. As shown in FIGS. 3 and 4, the 3D array 32 may include two, three, or more tiers. Each tier may include one or more layers used to form a horizontal array of memory cells. As described below, a single tier may include memory cells logically arranged in rows and columns in the horizontal plane of the array. In some embodiments, the memory cells may be single-level cells (SLC), multi-level cells (MLC), or any other suitable memory element.

The 3D array 32 may include a first tier 60 having a first two-dimensional plane of memory cells 62. A second tier 64 may be fully or partially formed over the first tier 60 in a direction perpendicular to the plane of the first tier 60. The second tier 64 includes a second two-dimensional plane of memory cells 66.

The first tier 60 includes word lines WL1_0-WL1_M and intersecting local digit lines DL1_0-DL1_N. The first tier 60 includes a memory cell, such as a floating gate transistor 68, located at each intersection of a word line (WL) and a string of memory cells coupled to a digit line (DL). The floating gate transistors 68 serve as non-volatile memory cells for storage of data in the memory array 32. As will be appreciated, each floating gate transistor 68 includes a source, a drain, a floating gate, and a control gate. The control gate of each floating gate transistor 68 is coupled to (and in at least some cases form) a respective local word line (WL). The floating gate transistors 68 are connected in series, source to drain, to form NAND strings 70, which are each formed between respective select gates. Specifically, each of the NAND strings 70 are formed between a local drain select gate 72 and a local source select gate 74. The drain select gates 72 and the source select gates 74 may each comprise a field-effect transistor (FET), for instance. A "column" of the first tier 60 includes a NAND string 70 and the source select gate 74 and drain select gate 72 connected thereto. A "row" of the floating gate transistors 68 are those transistors commonly coupled to a given access line, such as a word line (WL). As used herein, the terms "row" and "column" are used to describe the logical arrangement of the embodiment depicted in FIG. 3 and are not limiting to any specific physical arrangement. For example, in other embodiments a "rows" and/or "column" may include a stagger or other non linear arrangement, or the "rows" may not necessarily be perpendicular to the "columns" or vice-versa.

The second tier 64 includes word lines WL2_0-WL2_M and intersecting local digit lines DL2_0-DL2_N. Similar to the first tier 60, the second tier 64 includes a memory cell, such as a floating gate transistor 76, located at each intersection of a wordline (WL) and a string of memory cells coupled to a digitline (DL). The control gate of each floating gate transistor 76 is coupled to (and in at least some cases form) a respective local word line (WL). The floating gate transistors 76 may be connected in series, source to drain, to form NAND strings 78 formed between respective select gates. Each of the NAND strings 78 are formed between a local drain select gate 84 and a local source select gate 82. The drain select gates 84 and the source select gates 82 may each comprise a field-effect transistor (FET), for instance. A "column" of the second tier 64 includes a NAND string 78 and the source select gate 82 and drain select gate 84 connected thereto. A "row" of the floating gate transistors 76 are those transistors commonly coupled to a given access line, such as a word line (WL).

As shown in FIG. 3, each group of parallel wordlines for a tier are decoded together. The wordlines WL1_0-WL1_M of the first tier 60 are coupled to a first wordline decoder 86. The first wordline decoder 86 only decodes wordlines coupled to floating gate transistors 68 of the first tier 60. As also shown in FIG. 3, the wordlines WL2_0 and WL2_M are coupled to a second wordline decoder 88. The second wordline decoder 88 is only coupled to the wordlines of the floating gate transistors 76 of the second tier 64. As also shown in FIG. 3, the digitlines DL0 through DLN are coupled to a page buffer 85. In some embodiments, as described below, the decoders 86 and 88 may be in a single tier or base of the device 32. In other embodiments, each wordline decoder 86 and 88 may be a part of, e.g., in the same horizontal structure as, the respective tier. For example, the wordline decoder 86 may a part of the first tier 60 and the wordline decoder 88 may be a part of the second tier 64.

The wells (e.g., a p-well) of both the first tier 60 and the second tier 64 may be coupled together and to a well driver 89. As shown in FIG. 3, the contact for the well driver 89 may extend at least partially through the second tier 64 and the first tier 60 to the well driver 89.

Each tier of the array 32 may be uniquely accessed using the source and drain select gates of a selected tier. For example, the source select gates 82 of the second tier 64 may be used to couple the NAND strings of the second tier to a common source line (CSL) and CSL driver 87. The drain select gates 84 of the second tier may be used to couple the NAND strings of the second tier 64 to respective digitlines DL2_0 through DL2_N. The source select gates 74 of the first tier may also be used to couple the NAND strings of the first tier 60 to the common source line and the CSL driver 87, as a contact(s) that extend at least partially through the second tier 64 and the first tier 60 and couples, for example, the sources of the source select gates 82 to the sources of the source select gates 74. Thus, a contact couples each source select gate of the second tier 64 to a corresponding source select gate of the first tier 60. Each tier 60 and 64 may be uniquely selected by activating the select gates of a desired tier, i.e., by activating the source select gates of a desired tier via respective source select line (SSL) and activating the drain select gates of the desired tier via a respective drain select line (DSL). Any or all of the row and column decode circuitry, e.g., the wordline decoders, the page buffer, drivers, etc., may be located on a base logic substrate 91. The tiers 60 and 64 are disposed on the base logic substrate, such that the first tier 60 is disposed on the base logic substrate 91 and the second tier 64 is disposed on the first tier 60 in the manner described above. Thus, the connections described above, e.g., between wordlines and the wordline decoders 88 and 86 and/ the digitlines and page buffer 85, may electrically connect each tier 60 and 64 to the base logic substrate 91.

FIG. 4 is a schematic of another potential embodiment of the 3D array 32 illustrating a third tier 90 in accordance with an embodiment of the present invention. The 3D array 32 may include the first tier 60 and the second tier 64 described above. The third tier 90 includes a third two-dimensional plane of memory cells 92. As noted above, the memory cells 92 may be SLC memory elements, MLC memory elements, or any other suitable memory element.

The third tier 90 may be partially or fully formed over the second tier 64. The third tier 90 includes word lines WL3_0-WL3_M and intersecting local digit lines DL3_0-DL3_N. The third tier 90 includes a memory cell, such as a floating gate transistor 94, located at each intersection of a word line (WL) and a string of memory cells coupled to a digit line (DL).

The floating gate transistors 94 can be connected in series, source to drain, to form NAND strings 96 formed between respective select gates. Each of the NAND strings 96 are formed between a local drain select gate 98 and a local source select gate 100, which may each comprise a field-effect transistor (FET), for instance. A "column" of the first tier 90 includes a NAND string 96 and the source select gate 100 and drain select gate 98 connected thereto. A "row" of the floating gate transistors 94 are those transistors commonly coupled to a given access line, such as a word line (WL).

The digitlines of the third tier 90 are coupled to the page buffer 85. The wordlines WL3_0-WL3_N of the first tier 90 are coupled to a third wordline decoder 102. The third wordline decoder 102 only decodes wordlines coupled to floating gate transistors 94 of the first tier 90. Similarly, as described above with regard to the first and second tiers 60 and 64, the well contact extends through to the third tier 90, coupling the well of the third tier 90, second tier 64, and first tier 60 to the well driver 89. The wordline decoder 102 may a part of, e.g., of the same horizontal structure as, the third tier 90.

As in the embodiment depicted in FIG. 3, each tier of the array 32 can be uniquely decoded using the source and drain select gates of that tier. The source select gates 100 of the third tier 90 can also be used to couple the NAND strings 96 of the third tier to a common source line and the CSL driver 87. As mentioned above, a source line contact may extend at least partially through the third tier 90, the second tier 64, and the first tier 60, coupling the sources of the source select gates of each tier to the common source line (CSL) and CSL driver 87. The drains of the drain select gates 98 of the third tier 90 are coupled to respective digitlines and the page buffer 85. For example, the drains of the drain select gates 98 can be coupled to the drains of drain select gates 84 and 72 by digit line contacts extending at least partially through the third tier 90, second tier 64, and first tier 60. Thus, the digitline contacts couple the digitlines of each tier to the page buffer 85. Thus, each tier 90, 62, and 60 may be uniquely selected by activating the select gates for a desired tier. As described above, the row and column decode logic may all reside in the base logic substrate 91. Thus, the connections between the wordlines of the third tier 90 and the third wordline decoder 102 may electrically couple the wordlines of the third tier to the third wordline decoder 102.

Figure 5:
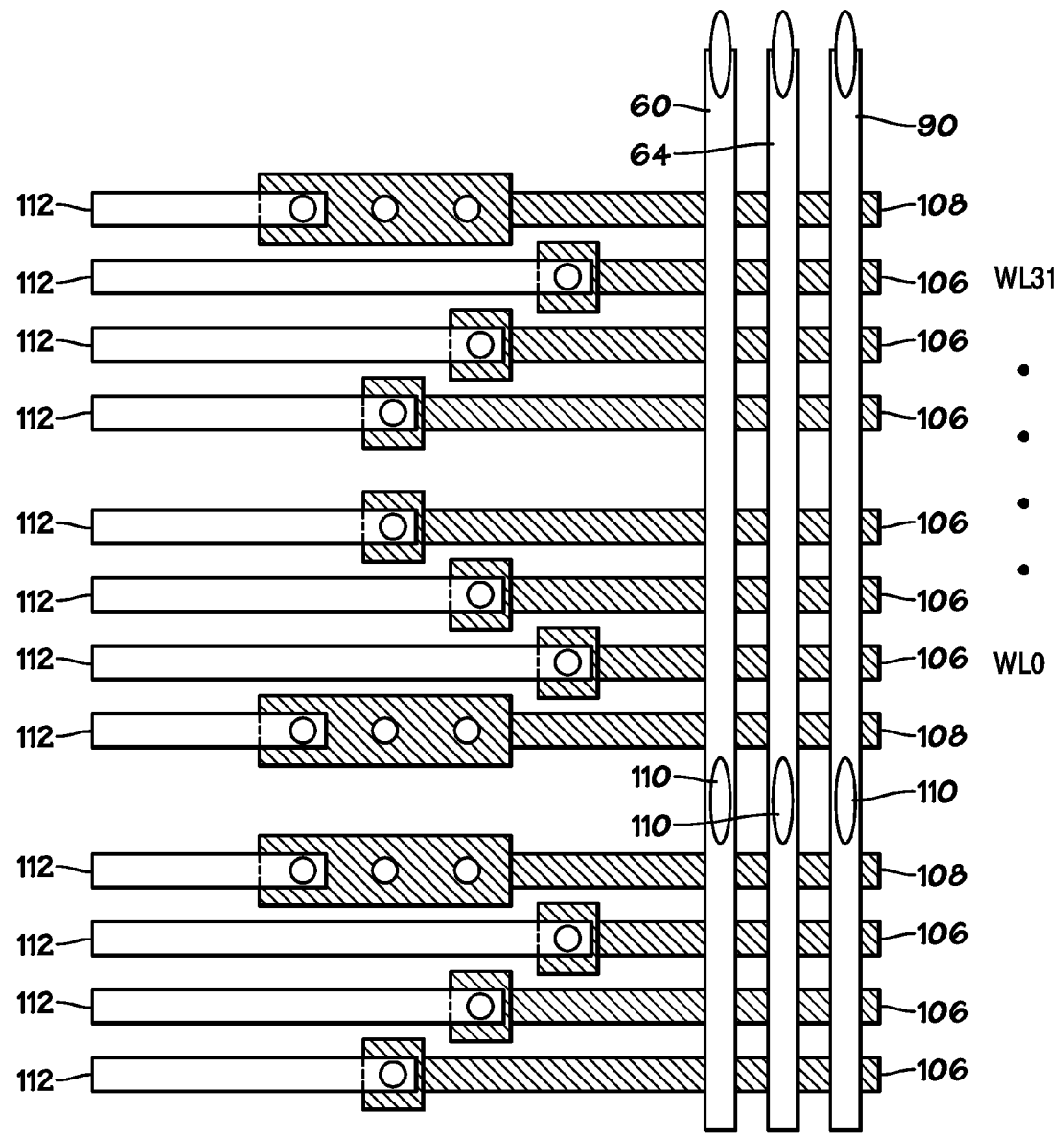
FIG. 5 is a cross-sectional diagram of the 3D array of FIG. 4 in accordance with an embodiment of the present invention.

FIG. 5 is a cross-sectional diagram showing the 3D array 32 in accordance with an embodiment of the present invention. FIG. 5 depicts wordlines 106 extending at least partially through one or more of the tiers 60, 64, and 90, select gate lines 108, and digitlines 110. Each of the wordlines 106 and select gate lines 108 may be coupled to an appropriate driver via conductors 112.

Figure 6:
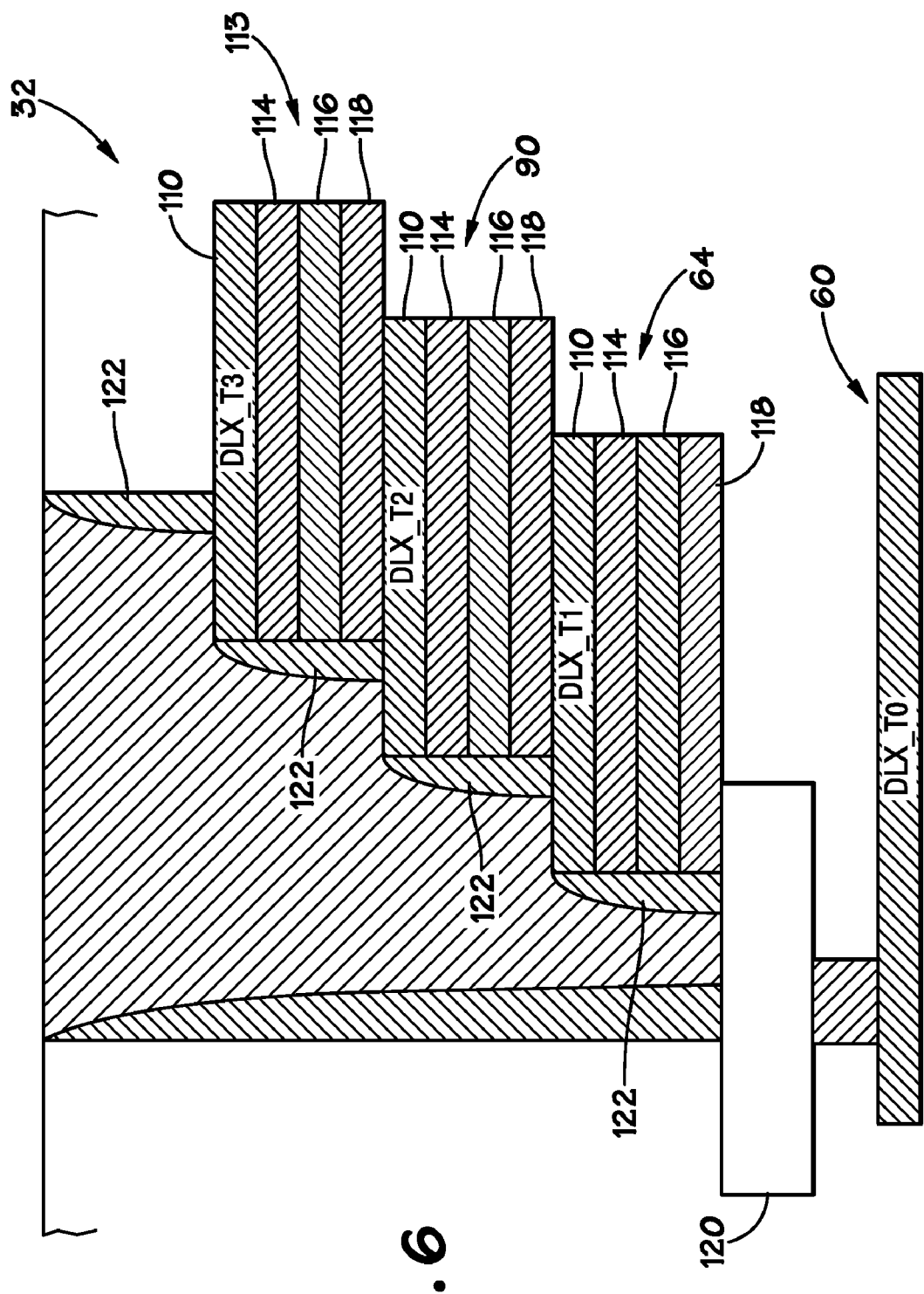
FIG. 6 is a cross-sectional view of the digitlines of a 3D array in accordance with an embodiment of the present invention.

FIG. 6 depicts a cross-sectional diagram of the digitlines of the tiers of the 3D NAND array 32 in accordance with an embodiment of the present invention. As depicted in FIG. 6, the 3D NAND array 32 includes the first tier 60, the second tier 64, and the third tier 90. Additionally, a fourth tier 113 is shown disposed on the third tier 90. As discussed above, the array 32 may include digitline conductors 110 in each tier, e.g., DLX_T0, DLX_T1, DLX_T2, and DLX_T3 (for the fourth tier 113).

The digitline conductors 110 provide contact between the digitline for that tier and a base logic substrate that provides the decoding logic. Also shown in each tier of FIG. 6 are a field oxide layer 114, a silicon layer 116, and a bonding oxide layer 118. Each tier may be bonded to the previous tier by Smart Cut or any suitable bonding technique. A final conductor 120 is also depicted to enable contact between the digitline conductors 110 and the underlying base logic substrate. An insulating spacer 122 may be provided to isolate each digitline conductor 110 of a tier from the silicon substrate layer. For example, as shown in FIG. 6, one of the insulating spacers electrically insulates the digitline conductors DLX_T1 from the silicon substrate layer of the second tier 64.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory array, comprising:
   a first tier comprising a first plurality of memory cells, a first plurality of source select gates, and a first plurality of drain select gates, wherein a string of memory cells of the first tier comprises one or more of the plurality of memory cells disposed between one of the plurality of source select gates and one of the plurality of drain select gates;
   a second tier formed at least partially over the first tier and comprising a second plurality of memory cells, a second plurality of source select gates, and a second plurality of drain select gates, wherein each of a string of memory cells of the second tier comprises one or more of the second plurality of memory cells disposed between one of the second plurality of source select gates and one of the second plurality of drain select gates;
   a first contact extending at least partially through the first tier and the second tier, the first contact coupling the first plurality of source select gates to the second plurality of source select gates and to a common source line;
   wherein the first tier comprises a first plurality of digitlines, wherein each of the first plurality of drain select gates is coupled to a respective one of the first plurality of digitlines, and wherein each of the first plurality of digitlines is coupled to a respective one of a second plurality of contacts adjacent to the first tier and the second tier and each of the first plurality of digitlines is laterally insulated from a respective one of the second plurality of contacts by an insulator disposed between a horizontal end of each of the first plurality of digitlines and the respective one of the second plurality of contacts; and
   wherein the second tier comprises a second plurality of digitlines, wherein each of the second plurality of drain select gates is coupled to a respective one of the second plurality of digitlines, and wherein each of the second plurality of digitlines is coupled to a respective one of the second plurality of contacts and each of the second plurality of digitlines is laterally insulated from a respective one of the second plurality of contacts by an insulator disposed between a horizontal end of each of the second plurality of digitlines and the respective one of the second plurality of contacts.

2. The memory array of claim 1, wherein the first plurality of digitlines and the second plurality of digitlines are coupled to a page buffer.

3. The memory array of claim 1, wherein the first plurality of source select gates and the second plurality of source select gates are coupled to a common source line driver via the common source line.

4. The memory array of claim 1, wherein the first tier and the second tier are coupled to a well contact that extends at least partially through the first tier and the second tier.

5. The memory array of claim 4, wherein the well contact is coupled to a well driver.

6. The memory array of claim 1, further comprising a third tier at least partially over the second tier and comprising a third plurality of memory cells, a third plurality of source select gates, and a third plurality of drain select gates, wherein a string of memory cells of the third tier comprises one or more of the third plurality of memory cells disposed between one of the third plurality of source select gates and one of the third plurality of drain select gates; wherein the first contact also couples the third plurality of source select gates to the common source line.

7. The memory array of claim 6, wherein the first contact further extends at least partially through the first tier, the second tier, and the third tier.

8. The memory array of claim 6, wherein the third tier comprises a third plurality of digitlines, wherein each of the third plurality of drain select gates is coupled to a respective one of the third plurality of digitlines, and wherein each of the third plurality of digitlines is coupled to a respective one of the second plurality of contacts adjacent to the first tier, the second tier, and the third tier and each of the third plurality of digitlines is laterally insulated from the second plurality of contacts.

9. A memory array, comprising:
   a first tier comprising a first plurality of memory cells, a first plurality of source select gates, a first plurality of drain select gates, a first plurality of digitlines, a first plurality of digitline conductors each coupled to a respective one of the first plurality of digitlines, and a first plurality of insulating spacers disposed between a horizontal end of each of the first plurality of digitlines and a respective one of the first plurality of digitline conductors;
   a second tier at least partially over the first tier and comprising a second plurality of memory cells, a second plurality of source select gates, a second plurality of drain select gates, a second plurality of digitlines, a second plurality of digitline conductors each coupled to a respective one of the second plurality of digitlines, and a second plurality of insulating spacers disposed between a horizontal end of each of the second plurality of digitlines and a respective one of the second plurality of digitline conductors;
   a first decoder;
   a first plurality of access lines coupled to the first plurality of memory cells of the first tier and to the first decoder;
   a second decoder; and
   a second plurality of access lines coupled to the second plurality of memory cells of the second tier and to the second decoder.

10. The memory array of claim 9, wherein the first decoder only decodes the first plurality of access lines.

11. The memory array of claim 9, wherein the second decoder only decodes the second plurality of access lines.

12. The memory array of claim 9, wherein the each of the first plurality of memory cells comprise a floating gate and a control gate.

13. The memory array of claim 9, wherein the each of the second plurality of memory cells comprise a floating gate and a control gate.

14. The memory array of claim 9, wherein the first plurality of source select gates and the first plurality of drain select gates comprise field effect transistors.

15. The memory array of claim 9, wherein the second plurality of source select gates and the second plurality of drain select gates comprise field effect transistors.

16. The memory array of claim 9, comprising a third tier at least partially over on the second tier and comprising a third plurality of memory cells, a third plurality of source select gates, and a third plurality of drain select gates.

17. The memory array of claim 16, comprising a third decoder and a third plurality of access lines coupled to the third tier and the third decoder.

18. The memory array of claim 17, wherein the third decoder only decodes the third plurality of wordlines.

19. The memory array of claim 9, comprising a contact coupled to each of the first plurality of source select gates and each of the second plurality of source select gates.

20. A system, comprising:
a memory controller;
a memory device coupled to the memory controller and comprising:
a memory array comprising:
a first tier comprising a first plurality of memory cells, wherein the first tier is accessed via a first plurality of source select gates of the first tier, a first plurality of drain select gates of the first tier, and a first plurality of digitlines each coupled to a respective one of the first plurality of drain select gates, wherein the first plurality of source select gates are coupled to a first contact extending at least partially through the first tier and a second tier, and the first plurality of digitlines are coupled to a respective one of a second plurality of contacts adjacent to the first tier and the second tier, wherein the first plurality of digitlines are laterally insulated from the second plurality of contacts by an insulator disposed between a horizontal end of each of the first plurality of digitlines and the respective one of the second plurality of contacts;
the second tier comprising a second plurality of memory cells, wherein the second tier is accessed via a second plurality of source select gates of the second tier, a second plurality of drain select gates of the second tier, and a second plurality of digitlines each coupled to a respective one of the second plurality of drain select gates, wherein the second plurality of source select gates are coupled to the first contact, and the second plurality of digitlines are coupled to a respective one of the second plurality of contacts, wherein the second plurality of digitlines are laterally insulated from the second plurality of contacts by an insulator disposed between a horizontal end of each of the second plurality of digitlines and the respective one of the second plurality of contacts.

21. The system of claim 20, comprising a processor coupled to the memory controller and the memory device.

22. A memory device, comprising:
a first tier comprising a first plurality of rows of memory cells, wherein each row of memory cells is coupled to one of a first plurality of wordlines;
a second tier at least partially over the first tier and comprising a second plurality of rows of memory cells, wherein each row of memory cells is coupled to one of a second plurality of wordlines;
a first decoder configured to decode the first plurality of wordlines; and
a second decoder configured to decode the second plurality of wordlines,
wherein the first tier comprises a first plurality of digitlines, wherein each of the first plurality of digitlines is coupled to a respective one of a plurality of contacts extending adjacent to the first tier and the second tier and the first plurality of digitlines are laterally insulated from the plurality of contacts by an insulator disposed between a horizontal end of each of the first plurality of digitlines and the respective one of the plurality of contacts; and
wherein the second tier comprises a second plurality of digitlines, wherein each of the second plurality of digitlines is coupled to a respective one of the plurality of contacts and the second plurality of digitlines are laterally insulated from the plurality of contacts by an insulator disposed between a horizontal end of each of the second plurality of digitlines and the respective one of the plurality of contacts.

23. The device of claim 22, wherein the first tier is accessed via a first plurality of source select gates and a first plurality of drain select gates.

24. The device of claim 23, wherein the second tier is accessed via a second plurality of source select gates and second plurality of drain select gates.

25. A method of operating a memory array, comprising:
accessing a first tier of memory cells via a first plurality of source select gates, a first plurality of drain select gates, and a first plurality of digitlines coupled to a respective one of a plurality of contacts, wherein the first plurality of digitlines are laterally insulated from the plurality of contacts by an insulator disposed between a horizontal end of each of the first plurality of digitlines and the respective one of the plurality of contacts; and
accessing a second tier of memory cells via a second plurality of source select gates, a second plurality of drain select gates, and a second plurality of digitlines coupled to a respective one of the plurality of contacts, wherein the second plurality of digitlines are laterally insulated from the plurality of contacts by an insulator disposed between a horizontal end of each of the second plurality of digitlines and the respective one of the plurality of contacts.

26. The method of claim 25, comprising decoding a first plurality of wordlines of the first tier via a first decoder and decoding a second plurality of wordlines of the second tier via a second decoder.

* * * * *